(12) United States Patent
Mankos

(10) Patent No.: US 11,276,549 B1
(45) Date of Patent: Mar. 15, 2022

(54) COMPACT ARRANGEMENT FOR ABERRATION CORRECTION OF ELECTRON LENSES

(76) Inventor: Marian Mankos, Palo Alto, CA (US)

( * ) Notice: Subject to any disclaimer, the term of this patent is extended or adjusted under 35 U.S.C. 154(b) by 3174 days.

(21) Appl. No.: 13/251,266

(22) Filed: Oct. 2, 2011

(51) Int. Cl.
 *H01J 37/153* (2006.01)
 *H01J 37/10* (2006.01)
 *H01J 37/244* (2006.01)

(52) U.S. Cl.
 CPC ............ *H01J 37/153* (2013.01); *H01J 37/10* (2013.01); *H01J 37/244* (2013.01); *H01J 2237/1534* (2013.01); *H01J 2237/2443* (2013.01)

(58) Field of Classification Search
 CPC ........ H01J 37/153; H01J 37/10; H01J 37/244; H01J 2237/1534; H01J 2237/2443
 See application file for complete search history.

(56) References Cited

U.S. PATENT DOCUMENTS 7,217,924 B1 * 5/2007 Mankos .................. H01J 37/05
250/305

\* cited by examiner

*Primary Examiner* — Nicole M Ippolito
*Assistant Examiner* — Hanway Chang

(57) ABSTRACT

One embodiment relates to apparatus for correcting aberrations introduced when an electron lens images a specimen. A specimen is illuminated, and a cathode objective lens accelerates emitted or scattered electrons. The resulting electron beam is deflected by a magnetic beam separator that disperses the incoming electron beam according to its energy. The dispersed beam is focused at the reflection plane of an electron mirror. After this focusing, and a second deflection by the beam separator, the beam dispersion is removed. The dispersion-free beam is reflected in a second electron mirror which corrects aberrations of the cathode objective lens. The beam separator then deflects the beam towards projection optics which form a magnified, aberration-corrected image. When energy filtering is needed, a knife-edge plate is inserted between the beam separator and first electron mirror to remove electrons outside the selected range.
Other embodiments are disclosed.

20 Claims, 11 Drawing Sheets

COMPACT ARRANGEMENT FOR ABERRATION CORRECTION OF ELECTRON LENSES

BACKGROUND OF THE INVENTION

Field of the Invention

The present invention relates generally to electron beam apparatus and electron microscopy methods.

Description of the Background Art

Optical microscopes, the simplest and most used instruments used to image objects too small for the naked eye to see, uses photons with visible wavelengths for imaging. The specimen is illuminated with a broad light beam, and a magnified image of the specimen can be observed using an eyepiece or camera. The maximum magnification of a light microscope can be more than 1000× with a diffraction-limited resolution limit of a few hundred nanometers. Improved spatial resolution in a optical microscope can be achieved when shorter wavelengths of light, such as the ultraviolet, are utilized for imaging.

An electron microscope is a type of microscope that uses electrons to illuminate the specimen and create a magnified image of it. The microscope has a greater resolving power than a light microscope, because it uses electrons that have wavelengths few orders of magnitude shorter than visible light, and can achieve magnifications exceeding 1,000,000×.

Scanning electron beam microscopes, the most widely used electron microscopes, image the sample surface by scanning it with a tightly focused high-energy beam of electrons in a raster scan pattern, pixel by pixel. In a typical SEM, an electron beam is emitted in a vacuum chamber from an electron gun equipped with a thermionic (tungsten, lanthanum hexaboride), thermally assisted (Schottky, zirconium oxide) or cold field emission cathode. The electron beam, which typically has an energy ranging from a few hundred eV to few tens keV, is collimated by one or more condenser lenses and then focused by the final objective lens to a spot about 1 nm to 100 nm in diameter. The beam is deflected by pairs of magnetic scanning coils or electrostatic deflector plates, sweeping in a raster fashion over a rectangular area of the specimen surface. Primary electrons can generate elastically scattered electrons, secondary electrons due to inelastic scattering, characteristic Auger electrons and the emission of electromagnetic radiation. Each of the generated signals can be detected by specialized detectors, amplified and displayed on a CRT display or captured digitally, pixel by pixel on a computer.

Low energy emission microscopes (LEEM), photoemission electron microscopes (PEEM) and transmission electron microscopes (TEM) are projection (as opposed to scanning) electron microscopes, and thus resemble a conventional light microscope. In a LEEM, the electron gun forms a broad electron beam that is accelerated to typically 10 to 30 keV and passed through a magnetic beam separator, an energy-dispersive device that separates the illumination and projection optics and bends the beam into the axis of a cathode objective lens, an electron lens containing the specimen. The objective lens is called a cathode lens as the specimen forms the negative electrode in this lens. A parallel flood beam then uniformly illuminates the specimen that is electrically biased at approximately the same potential as the cathode of the electron gun, so that illuminating electrons are decelerated in the objective lens, striking the specimen at energies typically between 0 to about 1000 eV. In the opposite direction, i.e. upward from the specimen, the objective lens simultaneously accelerates the reflected and scattered electrons and forms a magnified image of the specimen. As the electrons reenter the magnetic beam separator, they get deflected into the projection optics. The projection zoom optics forms an electron image on the scintillating screen that is then viewed by a CCD camera and further processed on a computer. The extremely low energy of the illuminating electrons makes LEEM an exquisitely sensitive surface imaging technique, capable of imaging single atomic layers with high contrast. The low landing energy of electrons is also critical for avoiding radiation damage, as high energy electrons in all keV kinetic energy ranges can cause unavoidable damage to many types of specimens.

Photoemission electron microscopes (PEEM) are projection electron microscopes, where the specimen is illuminated with UV photons or X-rays rather than electrons. Similar to a LEEM, the objective lens is a cathode lens with the specimen at a high negative bias. The photon flood beam uniformly illuminates the specimen, and the photoemitted electrons are accelerated by the objective lens and form a magnified image of the specimen.

One of the main drawbacks of a LEEM/PEEM is its lateral resolution. In spite of the short deBroglie wavelength in the Angstrom range, the lateral resolution of conventional LEEM instruments is limited to a few nm and sub-nm resolution has not been achieved yet; PEEM resolution ranges from 10 to 20 nm. The electron lenses used for imaging in a LEEM/PEEM, in particular the cathode objective lens, introduce spherical and chromatic aberrations that deteriorate the spatial resolution of a LEEM/PEEM. Effective means for improving the spatial resolution are therefore desirable if LEEM/PEEM instruments are to be used for imaging at higher spatial resolution.

SUMMARY

One embodiment pertains to an apparatus for correcting aberrations of an electron lens forming an image of a specimen. The specimen is illuminated with an electron, photon or X-ray beam, and a magnetic beam separator deflects the electron beam emitted from the specimen and magnified by a cathode objective lens towards a first electron mirror. The magnetic beam separator introduces an angular dispersion that disperses the incoming electron beam according to its energy. An electron lens is configured to focus the dispersed electron beam at the reflection plane of a first electron mirror and introduce symmetry so that the reflected electron beam passes through the magnetic beam separator a second time and exits without energy dispersion. The electron beam then enters a second electron mirror that is configured to correct for one or more aberrations of the cathode objective lens and reflect the electron beam back into the magnetic beam separator. After a third deflection through the magnetic beam separator the electron beam is transported into the projection optics and magnified on a viewing screen.

Another embodiment pertains to an apparatus for energy-filtered and aberration-corrected imaging of a specimen in a cathode objective lens. The specimen is illuminated with an electron, photon or X-ray beam, and a magnetic beam separator deflects the electron beam emitted from the specimen and magnified by a cathode objective lens towards a first electron mirror. The magnetic beam separator introduces an angular dispersion that disperses the incoming electron beam according to its energy. A knife-edge plate removes either the high or low energy tail from the propagating beam. An electron lens is configured to focus the dispersed electron beam at the reflection plane of a first electron mirror and introduce symmetry so that after the reflection, the other energy tail is stopped on the same knife-edge plate. The remaining nearly monochromatic beam reenters the magnetic beam separator and after the second deflection exits without energy dispersion. The electron beam then enters a second electron mirror that is configured to correct for one or more aberrations of the cathode objective lens and reflect the electron beam back into the magnetic beam separator. After a third deflection through the magnetic beam separator the electron beam is transported into the projection optics and magnified on a viewing screen.

Another embodiment pertains to a method for aberration correction when an electron lens is used to form an image of a specimen. A beam of low-energy electrons, photons or X-rays illuminates a specimen and a cathode objective lens forms an image with scattered or photoemitted electrons. The electron beam emitted from the specimen is deflected by a magnetic beam separator with energy dispersion towards a first electron mirror. The dispersed electron beam is focused by an electron lens at the reflection plane of the first electron mirror and symmetrically reflected back so that the electron beam after a second deflection by the magnetic beam separator exits without energy dispersion. One or more aberrations of the image formed by the dispersion-free electron beam are corrected by a second electron mirror. The electron beam is deflected a third time through the magnetic beam separator, transported into the projection optics and magnified on a viewing screen.

Another embodiment pertains to a method for aberration correction and energy-filtered imaging when a cathode objective lens is used to image a specimen. A beam of low-energy electrons, photons or X-rays illuminates a specimen and a cathode objective lens forms an image with scattered or photoemitted electrons. The electron beam emitted from the specimen is deflected by a magnetic beam separator with energy dispersion towards a first electron mirror. Either the high or the low energy tail of the propagating beam is removed by a knife edge plate. The remaining dispersed electron beam is focused by an electron lens at the reflection plane of the first electron mirror and symmetrically reflected back so that after the reflection, the other energy tail is stopped on the same knife-edge plate and the remaining nearly monochromatic electron beam reenters the magnetic beam separator and after the second deflection exits without energy dispersion. One or more aberrations of the image formed by dispersion-free electron beam are corrected by a second electron mirror. The monochromatic electron beam is deflected a third time through the magnetic beam separator, transported into the projection optics and magnified on a viewing screen.

Other embodiments are also disclosed.

DETAILED DESCRIPTION

Aberration Correction Using a Dispersion-free Magnetic Beam Separator

One approach to aberration correction in a LEEM is disclosed in U.S. Pat. No. 5,319,207, which is entitled "Imaging system for charged particles" and which issued Jun. 7, 1994 to inventors Harald Rose, Ralf Degenhardt and Dirk Preikszas. This approach employs a dispersion-free prism array as a magnetic beam separator and an electron mirror for aberration correction. In this approach, the energy filtering is accomplished by the inclusion of an omega filter in the projection optics, such as the one disclosed in U.S. Pat. No. 4,740,704, which is entitled "Omega-type electron energy filter" and which issued Apr. 26, 1988 to inventors Harald Rose and Stefan Lanio.

Figure 1A:
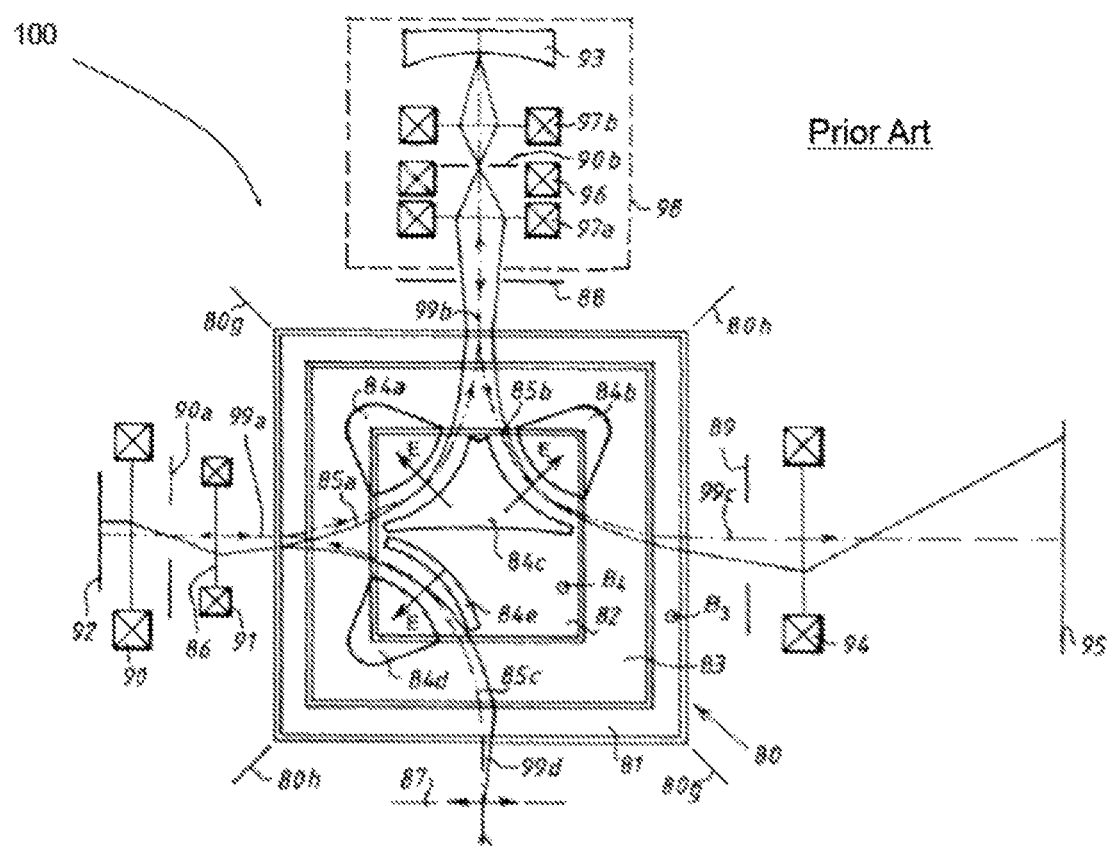
FIG. 1a is a diagram depicting a first prior structure for an electron beam apparatus having an aberration corrector and energy filter.

FIG. 1a is a diagram depicting a structure for this first prior electron beam apparatus 100. In this prior apparatus 100, the electron beam passes through a magnetic beam separator 80, an electron-optical element composed of an array of uniform magnetic and electric fields of different length and strength, which deflects the electrons by 90 degrees into the cathode objective lens 90. Alternatively, the magnetic beam separator 80 can be composed of a more complex array of uniform magnetic fields. Each deflection by 90 degrees in magnetic beam separator 80 is free of energy dispersion. The absence of energy dispersion after each 90 degree deflection assures that no combined aberrations between the energy dispersion and the chromatic and spherical aberrations of the electron mirror are generated. The cathode objective lens 90 decelerates and collimates the electron beam to form a parallel flood beam that illuminates the specimen 92. Electrons backscattered and secondary electron emitted by the specimen 92 are re-accelerated and focused in the cathode objective lens 90, passing back upwards through the prism separator 80, where they are bent into the electron mirror 93. The negative chromatic aberration of the electron mirror 93 is then adjusted so that the positive chromatic aberration of the cathode objective lens 90 is compensated. The common spherical aberration of objective lens 90 and electron mirror 93 is compensated by magnetic hexapole 96. Alternatively, both the chromatic and spherical aberration of the cathode objective lens 90 can be compensated by a more complex electron mirror 93. The electrons exiting electron mirror 93 enter magnetic beam separator 80, where they are deflected into the projection optics and form a high resolution image with corrected chromatic and spherical aberrations at the screen plane 95.

Figure 1B:
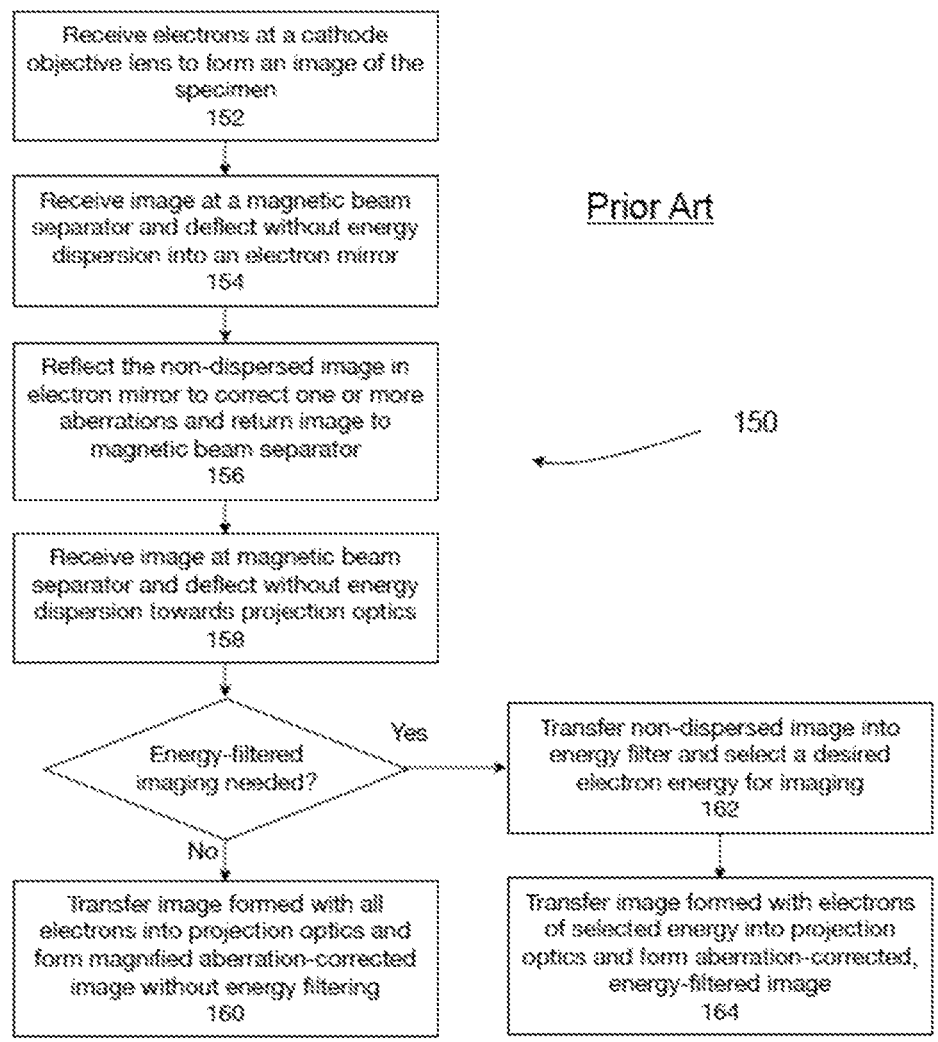
FIG. 1b is a flow chart depicting a first prior method for imaging of a specimen using an aberration corrector and energy filter.

FIG. 1b is a flow chart depicting a first prior method 150 for energy-filtered, aberration-corrected imaging. This prior method 150 may use the prior structure 100 described above in relation to FIG. 1a.

An electron beam is received 152 by an objective lens and forms an image that is blurred by the aberrations of the cathode objective lens. The blurred image is received 154 by a dispersion-free magnetic beam separator and deflected into an electron mirror. The dispersion-free image is then reflected 156 in the electron mirror to correct one or more aberrations and returned to the dispersion-free magnetic beam separator. After second deflection in the dispersion-free magnetic beam separator 158 the aberration-corrected image is deflected towards the projection optics. When no energy filtering is needed, the projection optics forms 160 a magnified, aberration-corrected image. When energy filtering is required, the aberration-corrected image is transferred 162 into an energy filter and a desired electron energy is selected for imaging. Finally, the projection optics forms 164 a magnified, energy-filtered and aberration-corrected image.

As described above, the prior apparatus 100 and method 150 use a dispersion-free magnetic separator 80. However, this prior technique is disadvantageous in some aspects. The practical implementation of this approach is rather difficult, due to complexity of the magnetic beam separator 80. The dispersion-free beam separator is a rather complex electron-optical element, consisting of a large number of coils with complex shapes that is difficult to construct and align. The machining, tight tolerances and assembly are challenging which makes tuning and alignment of the whole microscope difficult. In addition, the dispersion-free magnetic beam separator 80 cannot be used for energy filtering, and an additional energy filter must be included in the projection optics which further complicates the microscope design, assembly and alignment. The method and apparatus described below overcomes some of these disadvantages.

Aberration Correction Using Two Energy-dispersive Magnetic Beam Separators

Figure 2A:
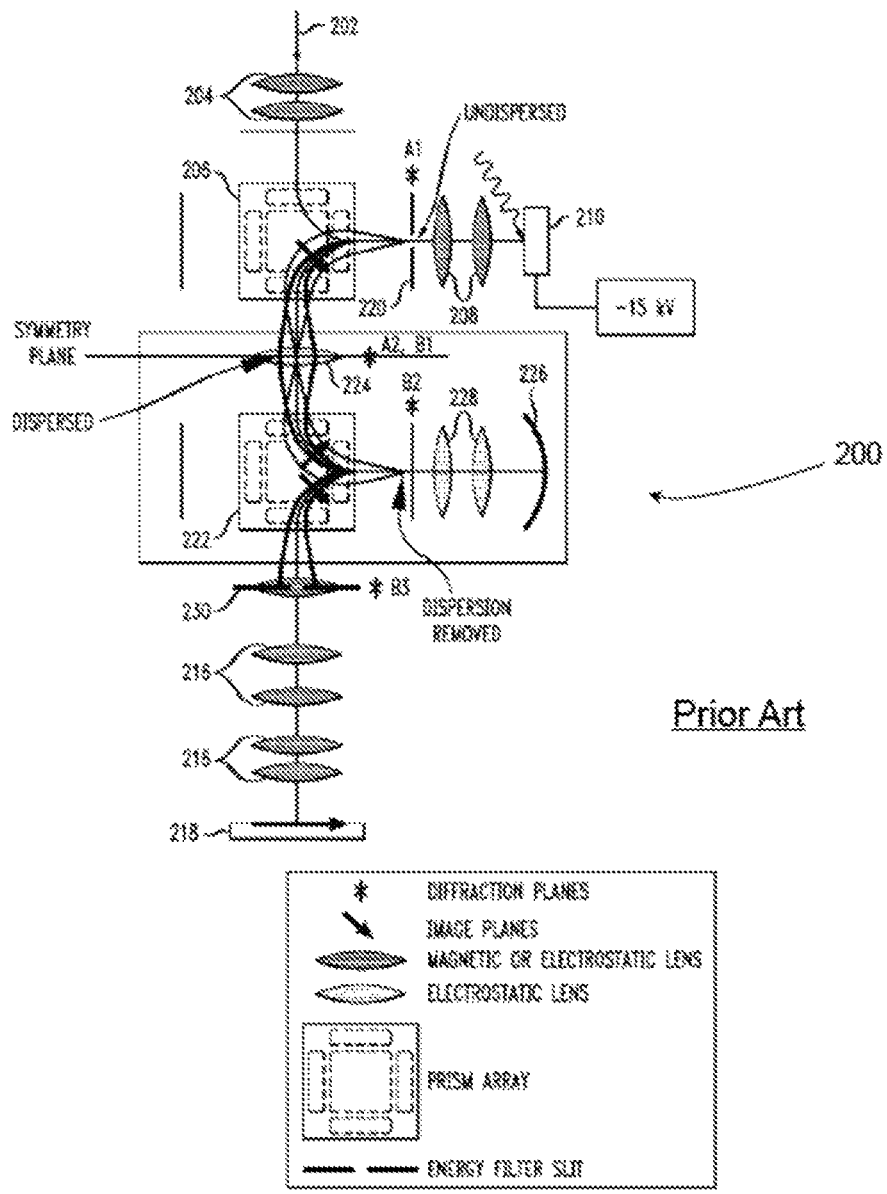
FIG. 2a is a diagram depicting a second prior structure for an electron beam apparatus having an aberration corrector and energy filter.

FIG. 2a is a diagram depicting a second structure for an electron beam apparatus incorporating aberration correction and energy-filtering in a LEEM. This prior apparatus 200 is disclosed in U.S. Pat. No. 7,348,566, which is entitled "Aberration-correcting cathode lens microscopy instrument" and which issued Mar. 25, 2008 to inventor Rudolf Tromp.

Unlike the prior technique using a complex dispersion-free magnetic beam separator discussed above in relation to FIGS. 1a and 1b, the presently disclosed apparatus and method does not require the separator to be free of dispersion in order to achieve aberration correction. Instead, it uses two dispersive magnetic beam separators of a practical design with simple square shaped coils that is much easier to machine, assemble and align. In addition, the presently disclosed technique does not require an additional energy filter to carry out energy-filtered imaging.

As shown in FIG. 2a, the apparatus 200 includes two magnetic beam separators 206 and 222 of a simple proven design that is easy to manufacture and simplifies overall microscope alignment and tuning. The electron beam emitted by an electron gun is collimated by illumination optics 204 into the magnetic beam separator 206, deflected by 90 degrees and focused by the cathode objective lens 208 to form a broad parallel beam that flood-illuminates the specimen 210. The electrons are scattered by the specimen 210, and form a two-dimensional image. The scattered electron beam is then accelerated and focused by the cathode objective lens 208, forming a magnified image in the achromatic plane of magnetic beam separator 206 located at the diagonal symmetry plane, and a diffraction pattern in the back-focal plane of cathode objective lens 208. Energy filtering of the real space image is carried out through the placement of a slit aperture 220 in the back-focal plane of objective lens 208, taking a slice across the diffraction pattern. The second magnetic beam separator 222, substantially identical to magnetic beam separator 206, is located below magnetic beam separator 206. Electrostatic lens 224, located symmetrically between the two magnetic beam separators 206 and 222, transfers the real space image from the achromatic plane of magnetic beam separator 206 to the achromatic plane of magnetic beam separator 222 at unit magnification. After a 90 degree deflection through second magnetic beam separator 222, the electron beam is free from energy dispersion, due to the imposed symmetry, and enters the electron mirror 226. It is critical to remove the energy dispersion, as otherwise combination aberrations between the dispersion and the chromatic and spherical aberrations of the electron mirror are introduced that can be larger than the original aberrations. Electron mirror 226 corrects for both chromatic and spherical aberration of cathode objective lens 208, and reflects the electron beam back into second magnetic beam separator 222. After a second 90 degree deflection through second magnetic beam separator 222, the electron beam becomes again energy dispersed. An exit aperture 230 is positioned to select a desired electron energy, and projection lenses 216 magnify the energy-filtered, real space image of specimen 210 onto a viewing screen 218.

Figure 2B:
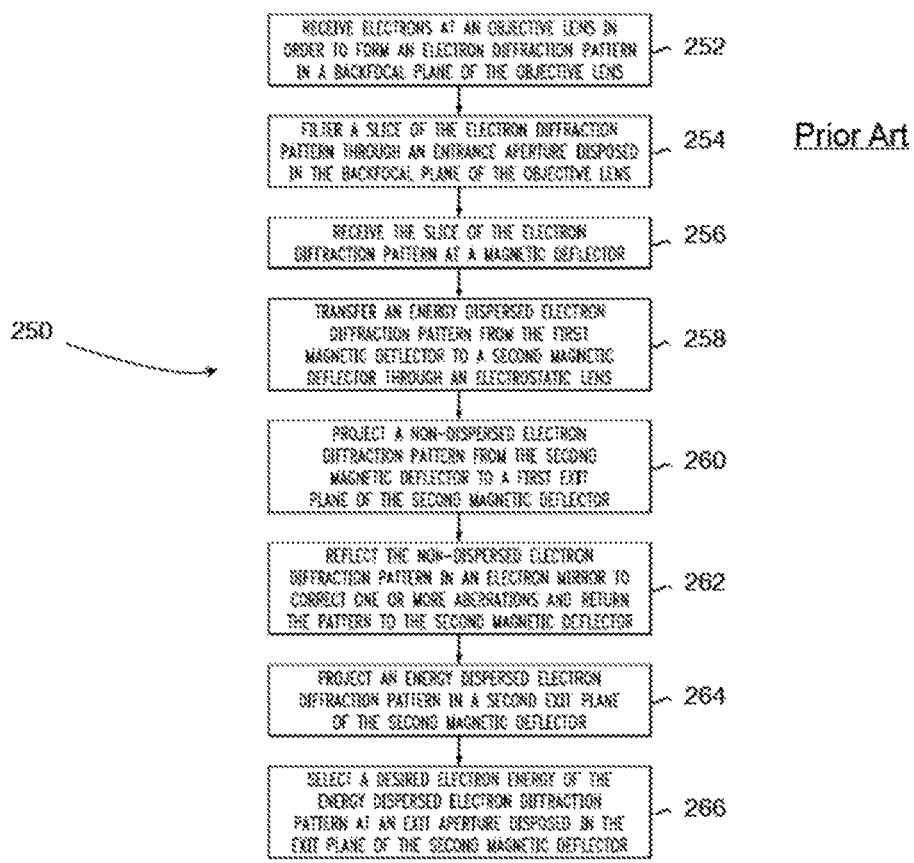
FIG. 2b is a flow chart depicting a second prior method for imaging of a specimen using an aberration corrector and energy filter.

FIG. 2b is a flow chart depicting a second prior method 250 for energy-filtered, aberration-corrected imaging in accordance with an embodiment of the invention. This prior method 250 may use the prior structure 200 described above in relation to FIG. 2a.

An electron beam is received 252 by an objective lens and forms a diffraction pattern of the specimen in the back-focal plane of the objective lens. A slice of the the diffraction pattern is passed 254 through a slit aperture located in the back-focal plane of the objective lens. The slice of the the diffraction pattern that passed through a slit aperture is received 256 by a first magnetic beam separator. The energy-dispersed diffraction pattern is then transferred 258 by an electrostatic lens located between the first beam separator and second beam separator, which is substantially identical to the first beam separator. After deflection in the second beam separator 260 the electron diffraction pattern is again free of energy dispersion. The non-dispersed electron diffraction pattern is then reflected 262 in an electron mirror to correct one or more aberrations and returned to the second magnetic beam separator. After second deflection in the second magnetic beam separator 264 the electron diffraction pattern becomes again energy-dispersed. Finally, a desired electron energy of the energy-dispersed electron diffraction pattern is selected 266 by an exit aperture.

However, this prior technique using two prism separators is disadvantageous in some aspects. The additional 90 degree deflection that transports the beam into the projection optics introduces energy dispersion that generates additional combination aberrations including image tilt and off-axis astigmatism which can affect the image quality when sub-nm resolution is needed. In addition, the two prism separators have to be identical to ensure that the dispersion and all combination aberrations of the first prism separator are cancelled by the second prism separator, which may be difficult to achieve practically. These issues can be resolved when a single prism separator and two electron mirrors are used to correct the aberrations of the cathode objective lens.

Aberration Correction Using a Single Energy-dispersive Magnetic Beam Separator and Two Electron Mirrors While the above discussed prior apparatus and methods provide aberration correction, improved apparatus and methods for providing aberration correction in a LEEM/PEEM are desirable. One distinct technique for aberration correction in a LEEM/PEEM using a single energy-dispersive magnetic beam separator and two electron mirrors is disclosed herein and discussed below.

Unlike the prior technique using a dispersion-free magnetic beam separator discussed above in relation to FIGS. 1a and 1b, the presently disclosed apparatus and method does not necessarily require a complex dispersion-free beam separator in order to achieve aberration correction. Instead, it uses a single energy-dispersive magnetic beam separator with practical design and simple square shaped coils that is much easier to machine, assemble and align.

Unlike the prior technique using two energy-dispersive magnetic beam separators discussed above in relation to FIGS. 2a and 2b, the presently disclosed apparatus and method does not require the use of an additional magnetic beam separator to achieve aberration correction. This prior technique may result in additional combination aberrations in the projection optics including image tilt and off-axis astigmatism which can affect the final image quality. In addition, small differences in the geometry and excitation between the two energy-dispersive magnetic beam separators may result in incomplete cancelation of the dispersion combination aberrations, which may prevent the aberration corrector from fully correcting the objective lens aberrations.

Figure 3:
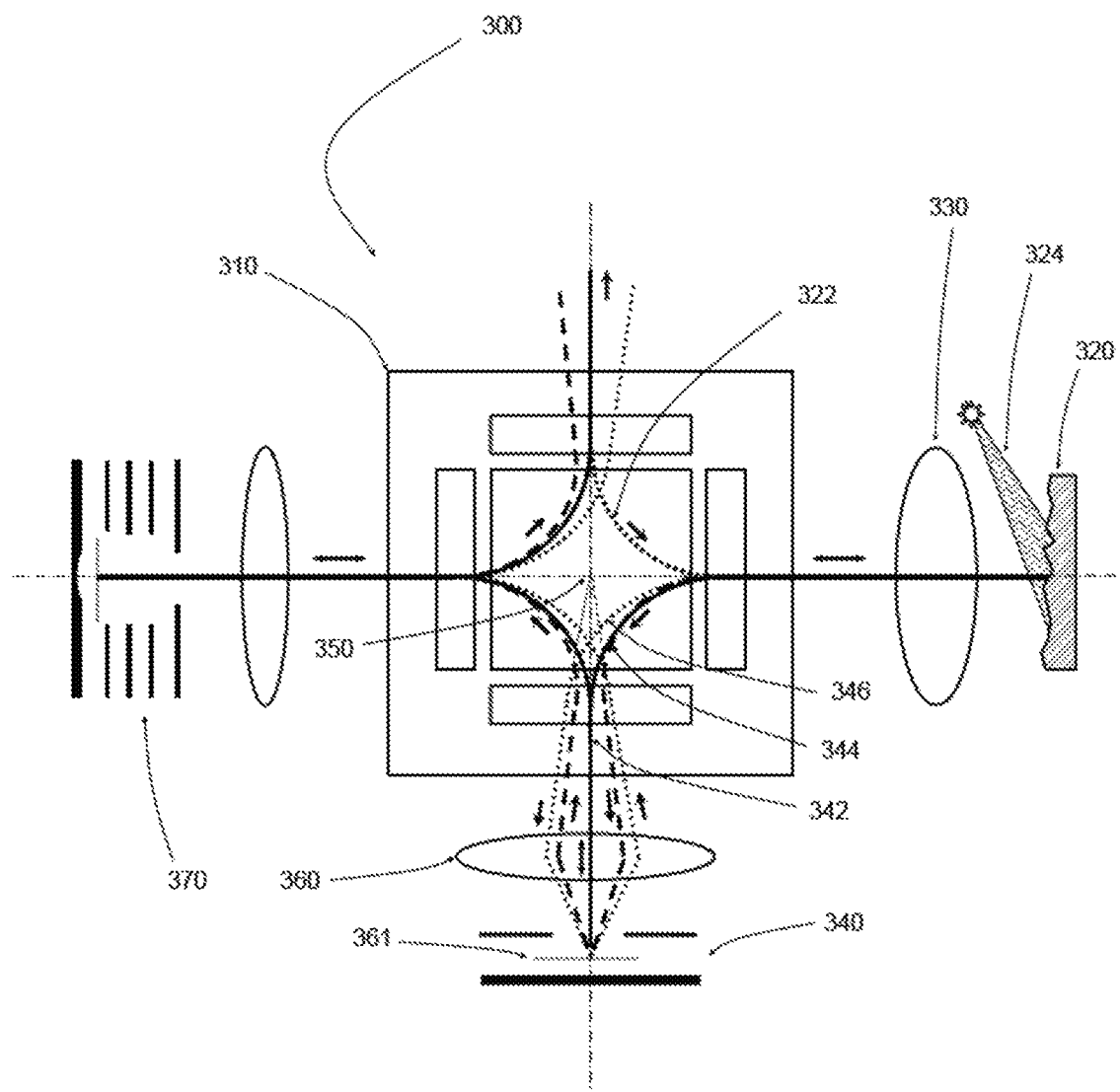
FIG. 3 is a diagram depicting a structure for an electron beam apparatus having an aberration corrector in accordance with an embodiment of the invention.

FIG. 3 is a diagram depicting a structure for an electron beam apparatus 300 having a single energy-dispersive magnetic beam separator and two electron mirrors in accordance with an embodiment of the invention. Such an apparatus 300 may be used to correct the aberrations of the cathode objective lens in a LEEM or PEEM and thus significantly improve its spatial resolution.

As shown in FIG. 3, the apparatus 300 includes a magnetic beam separator 310, an energy dispersive element composed of an array of uniform magnetic fields of different length and strength so as to provide a mechanism for simultaneous deflection and stigmatic focusing. Magnetic beam separator 310 has a practical and proven design that is easy to manufacture and simplifies overall microscope alignment and tuning. The specimen 320 is illuminated in a LEEM by a flood beam of electrons 322 that are decelerated and focused by the cathode objective lens 330, and in a PEEM by a flood beam of UV photons or X-rays 324. The cathode objective lens 330 then accelerates the electrons scattered or emitted by specimen 320 and forms a magnified image blurred by the aberrations of the cathode objective lens 330. The scattered electron beam then enters the magnetic beam separator 310 and is deflected towards an electron mirror 340. The strength of magnetic beam separator 310 is adjusted so that electrons 342 with nominal energy $E_0$ are deflected by 90 degrees and enter along the axis of electron mirror 340, while electrons 344 with slightly lower energy $E_0-\delta E_1$ are deflected by a slightly larger angle and electrons 346 with slightly larger energy $E_0+\delta E_2$ are deflected by a slightly smaller angle, due to the energy dispersion of the magnetic beam separator. The axial bundle of electron rays 342, 344 and 346 with energies in the range ($E_0-\delta E_1$, $E_0+\delta E_2$) appears to emanate from a point near the center plane of magnetic beam separator 310, also known as the achromatic plane 350. Transfer lens 360 is configured to focus the achromatic plane 350 at the reflection plane 361 of the electron mirror 340, which is biased more negative than the specimen 320 by few hundred V to a few kV, and thus reflects the electron rays 342, 344 and 346 back towards the magnetic beam separator 310. The first electron mirror 340 is configured to reflect the incoming electrons symmetrically, i.e. electrons entering at an angle with respect to the normal to the electron mirror reflection plane 361 exit the mirror at the same angle and symmetrically with respect to the normal to the electron mirror reflection plane 361 of first electron mirror 340. Electron rays 342, 344 and 346 are focused by transfer lens 360 at the achromatic plane 350 of magnetic beam separator 310 and deflected towards second electron mirror 370 that is configured as an aberration corrector. After the second deflection by magnetic beam separator 310 the dispersion vanishes due to the imposed symmetry, which is a prerequisite for aberration correction. It is critical to remove the energy dispersion, as otherwise combination aberrations between the dispersion and the chromatic and spherical aberrations of the electron mirror are introduced that can be larger than the original aberrations. Electron mirror 370 is configured to correct for both the chromatic and spherical aberration of cathode objective lens 330, and reflects the electron beam back into magnetic beam separator 310. After a third 90 degree deflection through magnetic beam separator 310, the electron beam becomes again energy-dispersed. The electron beam exiting magnetic beam separator 310 is transported into the projection optics and magnified on a viewing screen.

The prism- and two-electron mirror-based aberration corrector, as shown in FIG. 3, can be advantageously implemented in a PEEM and LEEM. The aberration corrector removes the spherical and chromatic aberrations that deteriorate the spatial resolution of both PEEMs and LEEMs.

Figure 4:
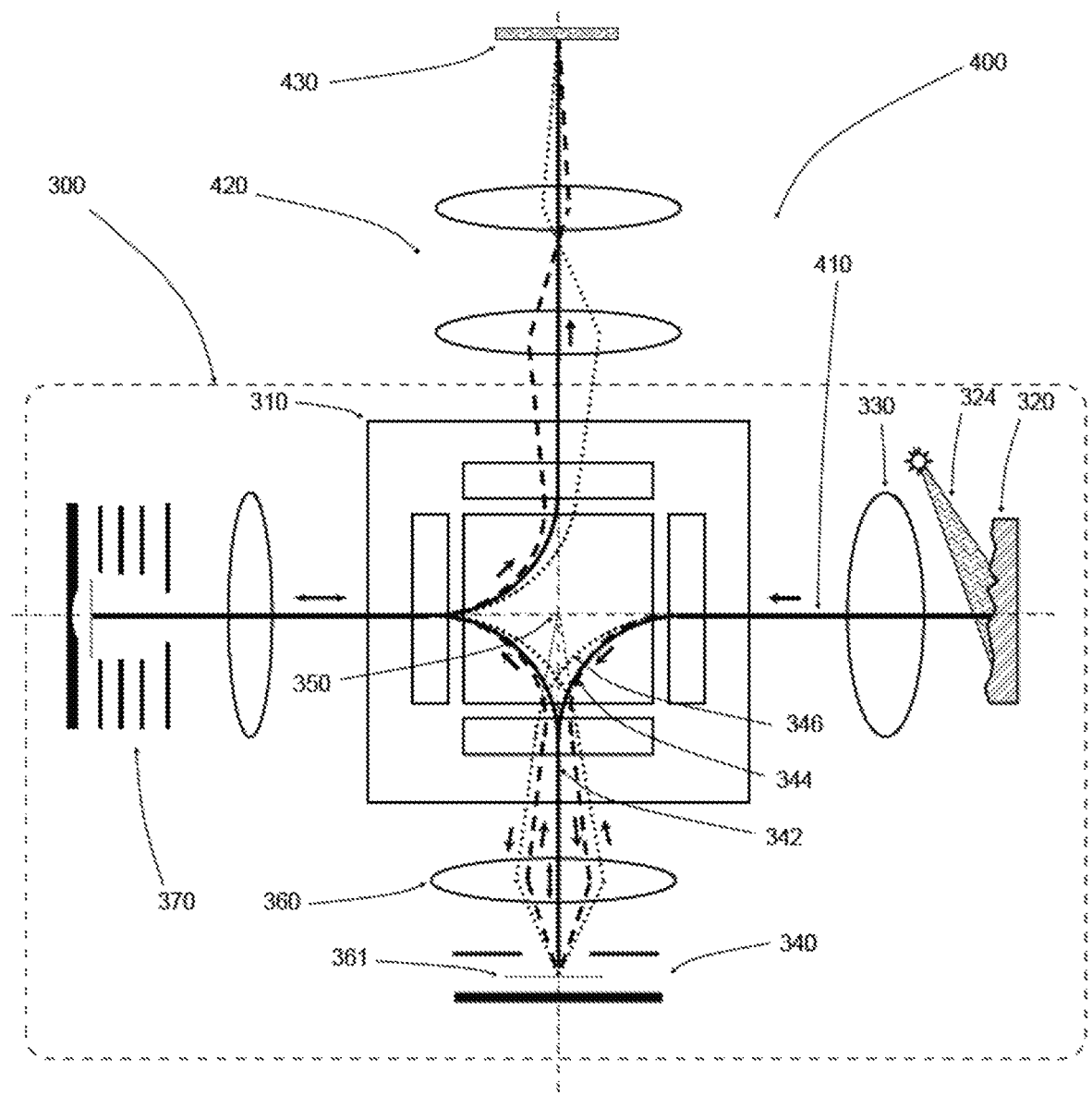
FIG. 4 is a diagram depicting a structure for a photoemission electron microscope having an aberration corrector in accordance with an embodiment of the invention.

FIG. 4 is a diagram depicting a structure for a photoemission electron microscope 400 comprising a magnetic beam separator 310, first electron mirror 340 and second electron mirror 370 that is configured as an aberration corrector 300. In this microscope 400, the flood beam of UV photons or X-rays illuminating specimen 320 generates photoelectrons 410 with energies in the range ($E_0-\delta E_1$, $E_0+\delta E_2$) that are accelerated by cathode objective lens 330 and form a magnified image blurred by the aberrations of the cathode objective lens 330. The photoelectron beam 410 then enters the magnetic beam separator 310 and is deflected towards electron mirror 340. The photoelectron beam 410 contains electrons with a range of energies ($E_0-\delta E_1$, $E_0+\delta E_2$), where $E_0$ is the mean energy selected for imaging. The strength of magnetic beam separator 310 is adjusted so that electrons 342 with energy $E_0$ are deflected by 90 degrees and enter along the axis of electron mirror 340, while electrons 344 with slightly lower energy $E_0-\delta E_1$ are deflected by a slightly larger angle and electrons 346 with slightly larger energy $E_0+\delta E_2$ are deflected by a slightly smaller angle, due to the energy dispersion of the magnetic beam separator 310. The axial bundle of photoelectrons 342, 344 and 346 with energies in the range ($E_0-\delta E_1$, $E_0+\delta E_2$) appears to emanate from a point near the center plane of magnetic beam separator 310, also known as the achromatic plane 350. Transfer lens 360 is configured to focus the achromatic plane 350 at the reflection plane 361 of electron mirror 340, which is biased more negative than the specimen 320 by few hundred V to a few kV, and thus reflects the photoelectrons 410 back towards the magnetic beam separator 310. The first electron mirror 340 is configured to reflect the incoming photoelectrons 410 symmetrically, i.e. electrons entering at an angle with respect to the normal to the electron mirror reflection plane 361 exit the mirror at the same angle and symmetrically with respect to the normal to the electron mirror reflection plane 361 of first electron mirror 340. Photoelectrons 410 are refocused by transfer lens 360 at the achromatic plane 350 of magnetic beam separator 310 and deflected towards second electron mirror 370 that is configured as an aberration corrector. After the second deflection by magnetic beam separator 310 the energy dispersion vanishes due to symmetry, which is a prerequisite for aberration correction. It is critical to remove the energy dispersion, as otherwise combination aberrations between the dispersion and the chromatic and spherical aberrations of the electron mirror are introduced that can be larger than the original aberrations. Electron mirror 370 is configured to correct for both chromatic and spherical aberration of cathode objective lens 330, and reflects the electron beam back into magnetic beam separator 310. After a third 90 degree deflection through magnetic beam separator 310, the electron beam becomes again energy dispersed. The specimen image is during every deflection located at the achromatic plane 350 of magnetic beam separator 310 so as to provide a dispersion-free image. The photoelectron beam exiting magnetic beam separator 310 is then transported into the projection optics 420 that forms a magnified image on viewing screen 430.

Figure 5:
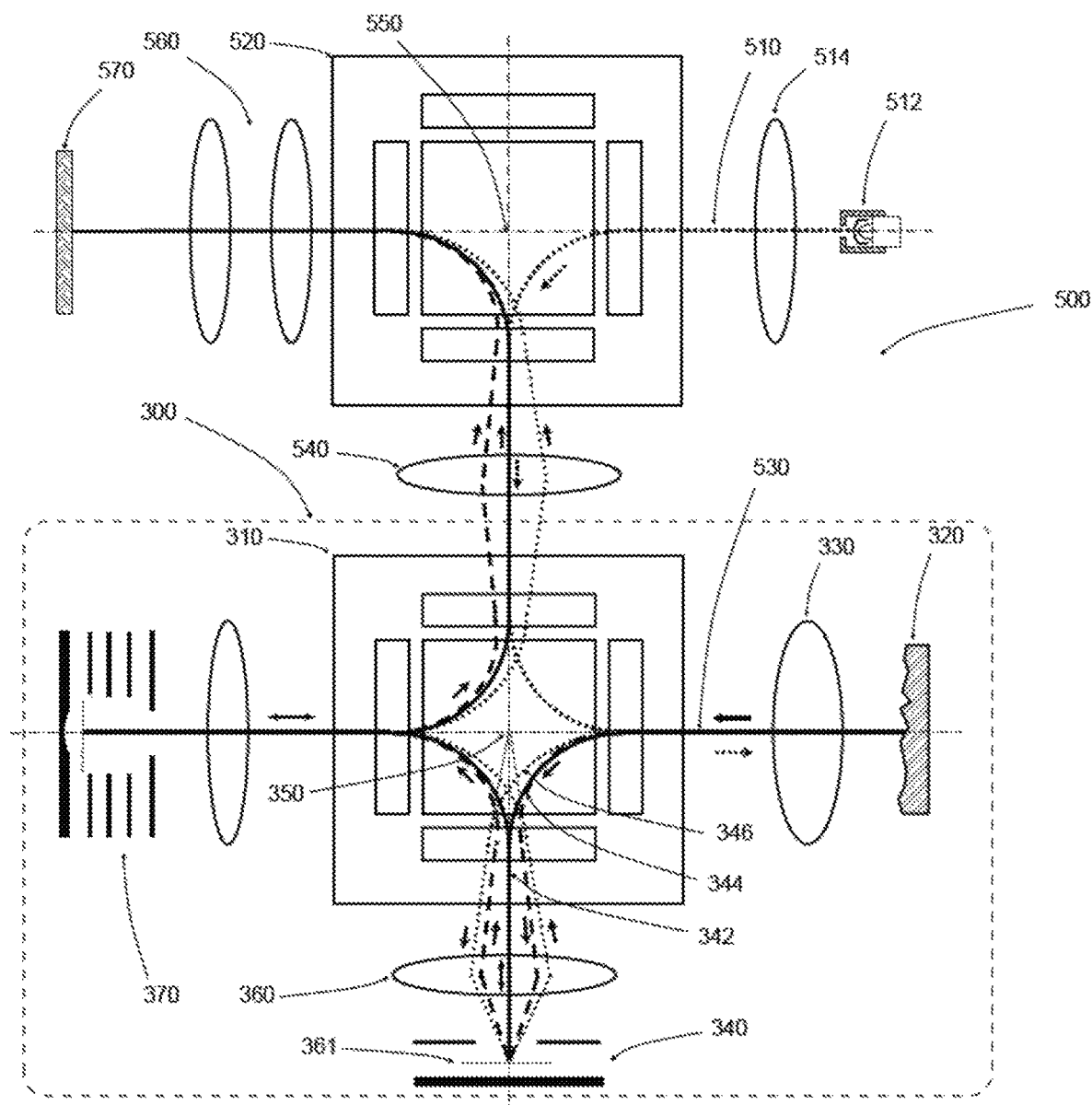
FIG. 5 is a diagram depicting a structure for a low energy electron microscope having an aberration corrector in accordance with an embodiment of the invention.

FIG. 5 is a diagram depicting a structure for a low energy electron microscope 500 comprising a magnetic beam separator 310, first electron mirror 340 and second electron mirror 370 that is configured as an aberration corrector 300. In this microscope 500, the primary electron beam 510 emitted from electron source 512 is collimated by illumination optics 514 into a second magnetic beam separator 520. The low energy electron microscope 500 requires an additional magnetic beam separator 520 in order to separate the illumination and projection optics. The primary electrons are deflected by magnetic beam separator 520 by 90 degrees and are transported into magnetic beam separator 310. The primary electrons 510 are deflected by magnetic beam separator 310 by 90 degrees towards the specimen 320, and focused by the cathode objective lens 330 to form a broad parallel beam that flood-illuminates the specimen 320. The primary electrons 510 are scattered by the specimen 320 and form a 2-dimensional image. The reflected scattered electron beam 530 then enters the magnetic beam separator 310 and is deflected towards electron mirror 340. The scattered electron beam 530 contains electrons with a range of energies ($E_0-\delta E_1$, $E_0+\delta E_2$), where $E_0$ is the mean energy selected for imaging. The strength of magnetic beam separator 310 is adjusted so that electrons 342 with nominal energy $E_0$ are deflected by 90 degrees and enter along the axis of electron mirror 340, while electrons 344 with slightly lower energy $E_0-\delta E_1$ are deflected by a slightly larger angle and electrons 346 with slightly larger energy $E_0+\delta E_2$ are deflected by a slightly smaller angle, due to the energy dispersion of the magnetic beam separator 310. The axial bundle of scattered electrons 342, 344 and 346 with energies in the range ($E_0-\delta E_1$, $E_0+\delta E_2$) appears to emanate from a point near the center plane of magnetic beam separator 310, also known as the achromatic plane 350. Transfer lens 360 is configured to focus the achromatic plane 350 at the reflection plane 361 of the electron mirror 340, which is biased more negative than the specimen 320 by few hundred V to a few kV, and thus reflects the scattered electrons 530 back towards the magnetic beam separator 310. The first electron mirror 340 is configured to reflect the incoming scattered electrons 530 symmetrically, i.e. electrons entering at an angle with respect to the normal to the electron mirror reflection plane 361 exit the mirror at the same angle and symmetrically with respect to the normal to the electron mirror reflection plane 361 of first electron mirror 340. Scattered electrons 530 are refocused by transfer lens 360 at the achromatic plane 350 of magnetic beam separator 310 and deflected towards second electron mirror 370 that is configured as an aberration corrector. After the second deflection by magnetic beam separator 310 the dispersion vanishes due to symmetry, which is a prerequisite for aberration correction. It is critical to remove the energy dispersion, as otherwise combination aberrations between the dispersion and the chromatic and spherical aberrations of the electron mirror are introduced that can be larger than the original aberrations. Electron mirror 370 is configured to correct for both chromatic and spherical aberration of cathode objective lens 330, and reflects the scattered electrons 530 back into magnetic beam separator 310. After a third 90 degree deflection through magnetic beam separator 310, the electron beam becomes again energy dispersed. The scattered electron beam exiting magnetic beam separator 310 is focused by transfer lens 540 so that the axial bundle of scattered electrons 342, 344 and 346 with energies in the range ($E_0-\delta E_1$, $E_0+\delta E_2$) emanating from achromatic plane 350 of magnetic beam separator 310 is focused at achromatic plane 550 of magnetic beam separator 520. This ensures that after the final deflection by magnetic beam separator 520 into projection optics 560 the dispersion again vanishes due to symmetry, so that combination aberrations between the magnetic prism separator dispersion and the chromatic and spherical aberrations of the projection lenses are removed. The scattered beam exiting magnetic beam separator 520 is then transported into the projection optics 560 and both the specimen image as well as the diffraction pattern can be magnified dispersion-free on viewing screen 570.

Figure 6:
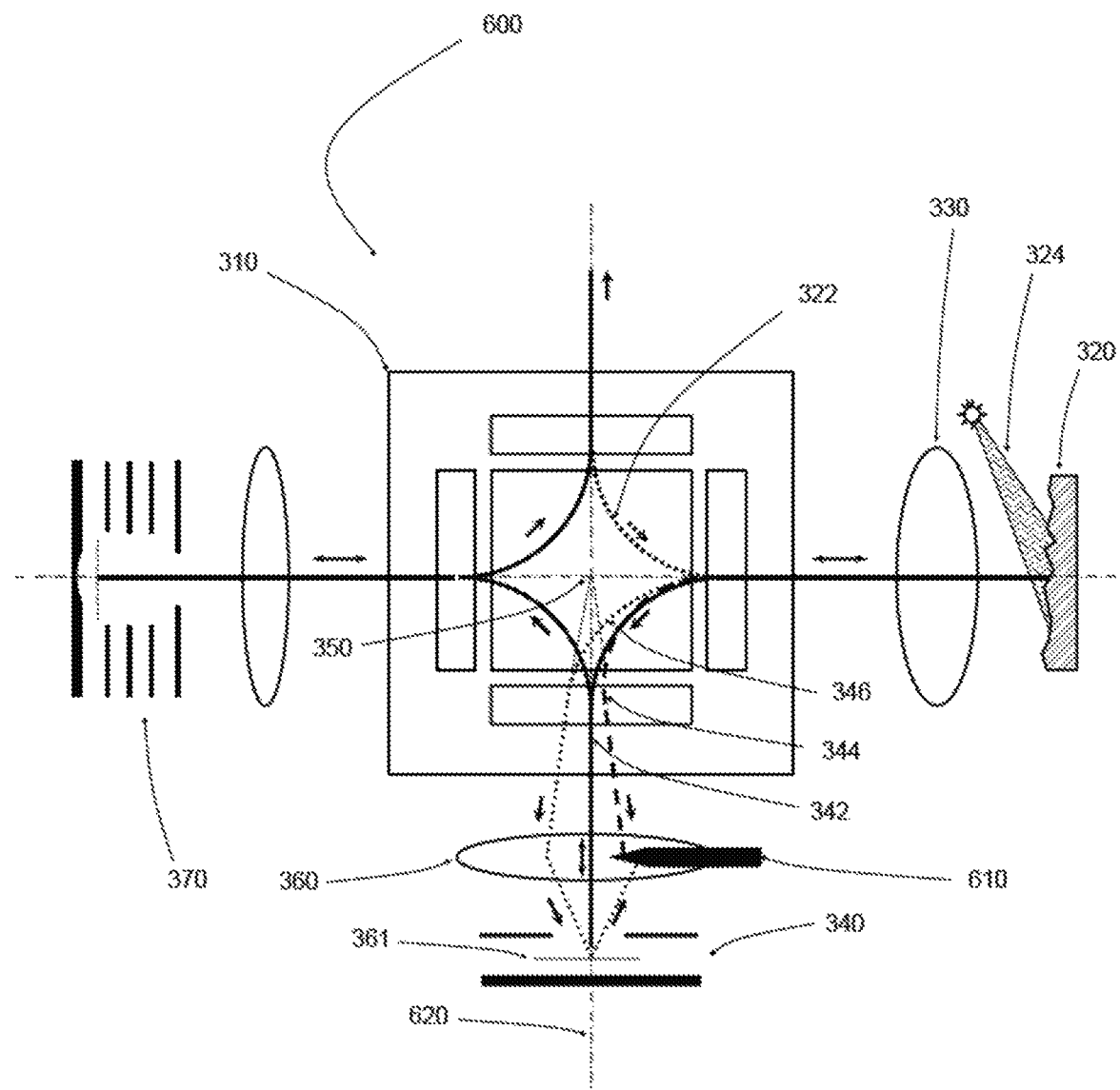
FIG. 6 is a diagram depicting a structure for an electron beam apparatus having an aberration corrector and energy filter in accordance with an embodiment of the invention.

FIG. 6 is a diagram depicting a structure for an electron beam apparatus 600 having a single dispersive prism separator and two electron mirrors in accordance with an embodiment of the invention. Such an apparatus 600 may be used to simultaneously correct the aberrations of the cathode objective lens in a LEEM or PEEM and provide energy filtering by selecting electrons with a narrow range of energies for imaging.

As shown in FIG. 6, the apparatus 600 includes a dispersive magnetic beam separator 310, an energy dispersive element composed of an array of uniform magnetic fields of different length and strength so as to provide a mechanism for simultaneous deflection and stigmatic focusing. Magnetic beam separator 310 has a practical and proven design that is easy to manufacture and simplifies overall microscope alignment and tuning. The specimen 320 is illuminated in a LEEM by a flood beam of electrons 322 that are decelerated and focused by the cathode objective lens 330, and in a PEEM by a flood beam of UV photons or X-rays 324. The cathode objective lens 330 then accelerates the electrons scattered or emitted by specimen 320 and forms a magnified image blurred by the aberrations of the cathode objective lens 330. The scattered electron beam then enters the magnetic beam separator 310 and is deflected towards electron mirror 340. The strength of magnetic beam separator 310 is adjusted so that electrons 342 with nominal energy $E_0$ are deflected by 90 degrees and enter along the axis 620 of electron mirror 340, while electrons 344 with slightly lower energy $E_0-\delta E_1$ are deflected by a slightly larger angle and electrons 346 with slightly larger energy $E_0+\delta E_2$ are deflected by a slightly smaller angle, due to the energy dispersion of the magnetic beam separator 310. The axial bundle of electron rays 342, 344 and 346 with energies in the range ($E_0-\delta E_1$, $E_0+\delta E_2$) appears to emanate from a point near the center plane of magnetic beam separator 310, also known as the achromatic plane 350. As the electrons proceed towards the electron mirror 340, a movable knife-edge plate 610 located slightly to the right of the vertical optical axis 620 stops one portion of the energy distribution, in this particular case the lower energy electrons 344 with energies smaller than $E_0$ as shown in FIG. 6. In an alternate implementation, it is also possible to locate the movable knife-edge plate 610 slightly to the left of the vertical optical axis 620, in which case the electrons 346 with energies larger than $E_0$ are stopped. The transfer lens 360 is configured to focus the achromatic plane 350 at the reflection plane 361 of the electron mirror 340, which is biased to a potential more negative than the specimen 320 by a few hundred Volts to a few kiloVolt, and thus reflects the remaining electrons 342 and 346 back towards the prism separator 310. The electron mirror 340 is configured to reflect the incoming electrons symmetrically, i.e. electrons entering at an angle with respect to the normal to the electron mirror reflection plane 361 exit the mirror at the same angle and symmetrically with respect to the normal to the electron mirror reflection plane 361. As the remaining electrons 342 and 346 proceed back to the prism separator 310, the electrons 346 with energies larger than $E_0$ are stopped by the same knife-edge plate 610, due to the symmetry of the reflection in the electron mirror 340. The energy width of the remaining nearly monochromatic electrons 342 with energy $E_0$ selected for imaging is defined by the position of the knife-edge plate 610 and can be adjusted by moving the knife-edge plate 610 away or towards the optical axis 620. This arrangement allows the use of a knife-edge plate as the energy selecting device, which is much simpler when compared to the narrow, often sub-micron slits needed in typical imaging energy filter applications. The mechanical design and manufacture of a knife-edge plate is much less complex when compared to a narrow slit aperture with straight and parallel edges and thus allows to select a much narrower energy distribution. In this design, an energy width of 0.2 eV or less is readily achievable. In addition, the reliability of operation of a knife-edge plate under heavy electron bombardment is much improved when compared to slit apertures, as sub-micron slits tend to clog with electron-beam induced contamination. The remaining nearly mono-energetic electrons 342 with energy $E_0$ selected for imaging are focused by transfer lens 360 at the achromatic plane 350 of magnetic beam separator 310 and deflected towards second electron mirror 370 that is configured as an aberration corrector. After the second deflection by magnetic beam separator 310 the dispersion vanishes due to symmetry, which is a prerequisite for aberration correction. It is critical to remove the energy dispersion, as otherwise combination aberrations between the dispersion and the chromatic and spherical aberrations of the electron mirror are introduced that can be larger than the original aberrations. Electron mirror 370 is configured to correct for both chromatic and spherical aberration of cathode objective lens 330, and reflects the electron beam back into magnetic beam separator 310. After a third 90 degree deflection through magnetic beam separator 310, the electron beam becomes again energy dispersed, although the range of electron energies is significantly reduced due to the energy filtering arrangement. The energy-filtered electron beam exiting magnetic beam separator 310 is ready to be transported into the projection optics that will form a magnified, aberration-corrected and energy-filtered image on the viewing screen.

The prism- and two-electron mirror-based aberration corrector with energy-filtering capability, as shown in FIG. 6, can be advantageously implemented in a PEEM and LEEM. The aberration corrector removes the spherical and chromatic aberrations that deteriorate the spatial resolution of both PEEMs and LEEMs, and the energy filtering capability allows to select a narrow range of electron energies for imaging.

Figure 7:
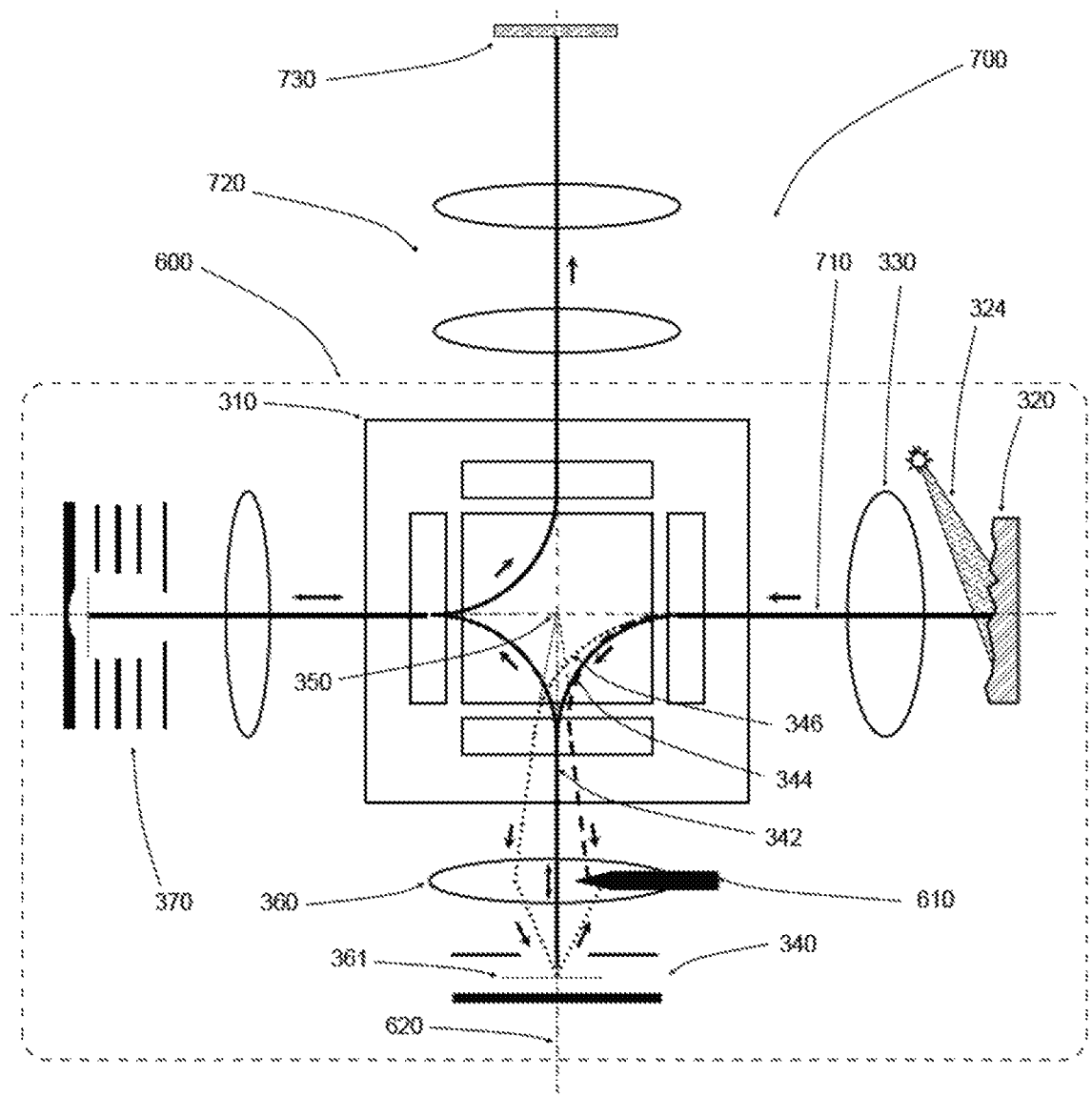
FIG. 7 is a diagram depicting a structure for a photoemission electron microscope having an aberration corrector and energy filter in accordance with an embodiment of the invention.

FIG. 7 is a diagram depicting a structure for a photoemission electron microscope 700 comprising a magnetic beam separator 310, first electron mirror 340 and second electron mirror 370 that is configured as an aberration corrector and energy filter 600. In this microscope 700, the flood beam of UV photons or X-rays illuminating specimen 320 generates photoelectrons 710 with energies in the range ($E_0-\delta E_1$, $E_0+\delta E_2$) that are accelerated by cathode objective lens 330 and form a magnified image blurred by the aberrations of the cathode objective lens 330. The photoelectron beam 710 then enters the magnetic beam separator 310 and is deflected towards electron mirror 340. The photoelectron beam 710 contains electrons with a range of energies ($E_0-\delta E_1$, $E_0+\delta E_2$), where $E_0$ is the mean energy selected for imaging. The strength of magnetic beam separator 310 is adjusted so that electrons 342 with energy $E_0$ are deflected by 90 degrees and enter along the axis of electron mirror 340, while electrons 344 with slightly lower energy $E_0-\delta E_1$ are deflected by a slightly larger angle and electrons 346 with slightly larger energy $E_0+\delta E_2$ are deflected by a slightly smaller angle, due to the energy dispersion of the prism array. The axial bundle of photoelectrons 342, 344 and 346 with energies in the range ($E_0-\delta E_1$, $E_0+\delta E_2$) appears to emanate from a point near the center plane of magnetic beam separator 310, also known as the achromatic plane 350. As the electrons proceed towards the electron mirror 340, a movable knife-edge plate 610 located slightly to the right of the vertical optical axis 620 stops one portion of the energy distribution, in this particular case the lower energy electrons 344 with energies smaller than $E_0$ as shown in FIG. 7. In an alternate implementation, it is also possible to locate the movable knife-edge plate 610 slightly to the left of the vertical optical axis 620, in which case the electrons 346 with energies larger than $E_0$ are stopped. The transfer lens 360 is configured to focus the achromatic plane 350 at the reflection plane 361 of the electron mirror 340, which is biased to a potential more negative than the specimen 320 by a few hundred Volts to a few kiloVolt, and thus reflects the remaining electrons 342 and 346 back towards the prism separator 310. The electron mirror 340 is configured to reflect the incoming electrons symmetrically, i.e. electrons entering at an angle with respect to the normal to the electron mirror reflection plane 361 exit the mirror at the same angle and symmetrically with respect to the normal to the electron mirror reflection plane 361. As the remaining electrons 342 and 346 proceed back to the prism separator 310, the electrons 346 with energies larger than $E_0$ are stopped by the same knife-edge plate 610, due to the symmetry of the reflection in the electron mirror 340. The energy width of the remaining nearly monochromatic electron beam 342 with energy $E_0$ selected for imaging is defined by the position of the knife-edge plate 610 and can be adjusted by moving the knife-edge plate 610 away or towards the optical axis 620. This arrangement allows the use of a knife-edge plate as the energy selecting device, which is much simpler when compared to the narrow, often sub-micron slits needed in typical imaging energy filter applications. The mechanical design and manufacture of a knife-edge plate is much less complex when compared to a narrow slit aperture with straight and parallel edges and thus allows to select a much narrower energy distribution. In this design, an energy width of 0.2 eV or less is readily achievable. In addition, the reliability of operation of a knife-edge plate under heavy electron bombardment is much improved when compared to slit apertures, as sub-micron slits tend to clog with electron-beam induced contamination. The remaining nearly monochromatic electrons 342 with energy $E_0$ selected for imaging are focused by transfer lens 360 at the achromatic plane 350 of magnetic beam separator 310 and deflected towards second electron mirror 370 that is configured as an aberration corrector. After the second deflection by magnetic beam separator 310 the dispersion vanishes due to symmetry, which is a prerequisite for aberration correction. It is critical to remove the energy dispersion, as otherwise combination aberrations between the dispersion and the chromatic and spherical aberrations of the electron mirror are introduced that can be larger than the original aberrations. Electron mirror 370 is configured to correct for both chromatic and spherical aberration of cathode objective lens 330, and reflects the electron beam back into magnetic beam separator 310. After a third 90 degree deflection through magnetic beam separator 310, the electron beam becomes again energy dispersed, although the range of electron energies is significantly reduced due to the energy filtering arrangement. In addition, the specimen image is during every deflection located at the achromatic plane 350 of magnetic beam separator 310 so as to provide dispersion-free imaging. The energy-filtered electron beam exiting magnetic beam separator 310 is then transported into the projection optics 720 that forms a magnified, aberration-corrected and energy-filtered image on viewing screen 730.

Figure 8:
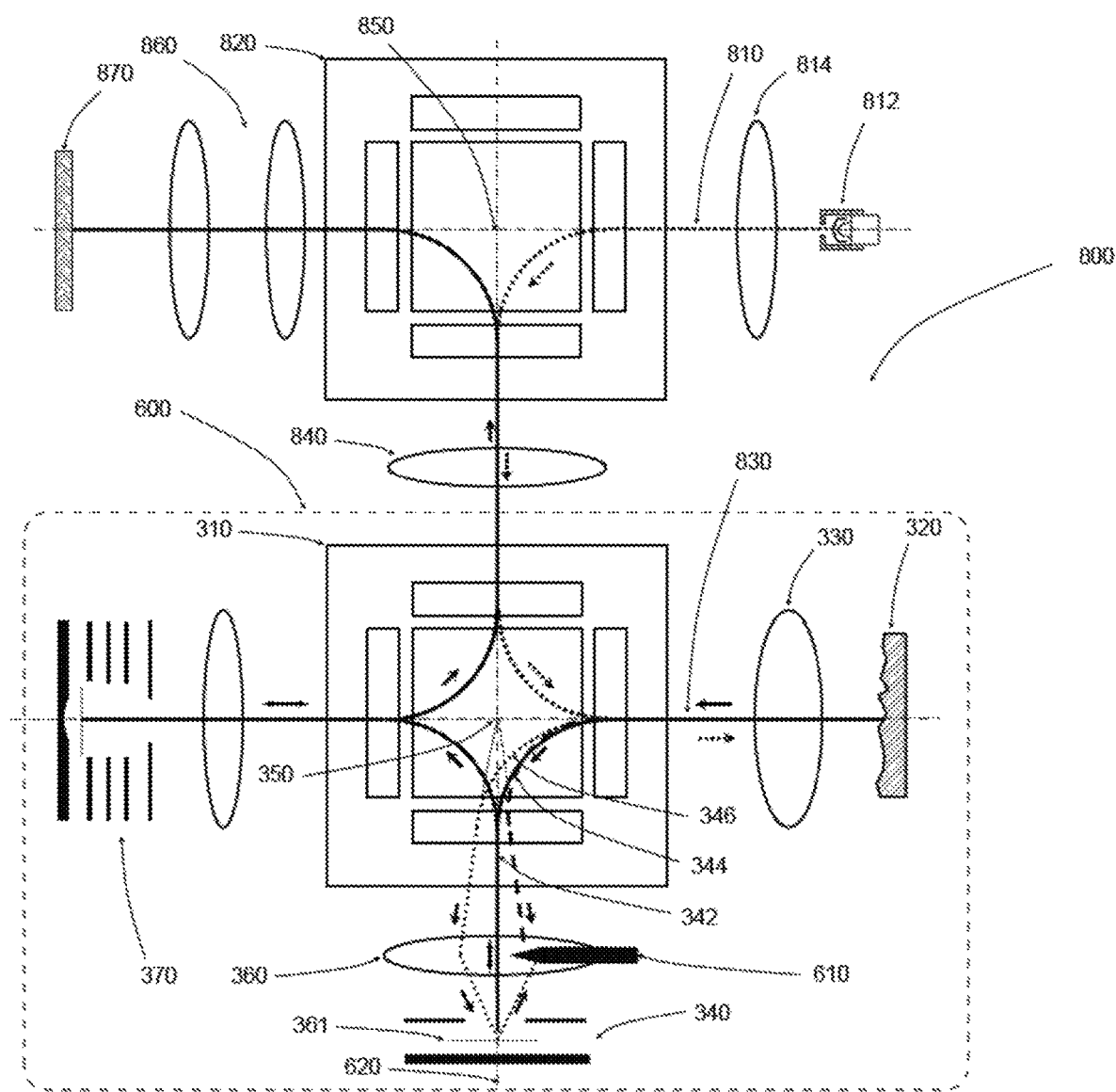
FIG. 8 is a diagram depicting a structure for a low energy electron microscope having an aberration corrector and energy filter in accordance with an embodiment of the invention.

FIG. 8 is a diagram depicting a structure for a low energy electron microscope 800 comprising a magnetic beam separator 310, first electron mirror 340 and second electron mirror 370 that is configured as an aberration corrector and energy filter 600. In this microscope 800, the primary electron beam 810 emitted by electron source 812 is collimated by illumination optics 814 into second magnetic prism separator 820. The low energy electron microscope 800 requires an additional magnetic prism separator 820 in order to separate the illumination and projection optics. The primary electrons are deflected by magnetic beam separator 820 by 90 degrees and are transported into magnetic prism separator 310. The primary electrons 810 are deflected by magnetic beam separator 820 by 90 degrees towards the specimen 320, and focused by the cathode objective lens 430 to form a broad parallel beam that flood-illuminates the specimen 320. The primary electrons 810 are scattered by the specimen 320 and form a 2-dimensional image. The reflected scattered electron beam 830 then enters the magnetic beam separator 310 and is deflected towards electron mirror 340. The scattered electron beam 830 contains electrons with a range of energies $(E_0-\delta E_1, E_0+\delta E_2)$, where $E_0$ is the nominal energy selected for imaging. The strength of magnetic beam separator 310 is adjusted so that electrons 342 with nominal energy $E_0$ are deflected by 90 degrees and enter along the axis of electron mirror 340, while electrons 344 with slightly lower energy $E_0-\delta E_1$ are deflected by a slightly larger angle and electrons 346 with slightly larger energy $E_0+\delta E_2$ are deflected by a slightly smaller angle, due to the energy dispersion of the magnetic beam separator 310. The axial bundle of scattered electrons 342, 344 and 346 with energies in the range $(E_0-\delta E_1, E_0+\delta E_2)$ appears to emanate from a point near the center plane of magnetic beam separator 310, also known as the achromatic plane 350. As the scattered electrons proceed towards the electron mirror 340, a movable knife-edge plate 610 located slightly to the right of the vertical optical axis 620 stops one portion of the energy distribution, in this particular case the lower energy electrons 344 with energies smaller than $E_0$ as shown in FIG. 8. In an alternate implementation, it is also possible to locate the movable knife-edge plate 610 slightly to the left of the vertical optical axis 620, in which case the electrons 346 with energies larger than $E_0$ are stopped. The transfer lens 360 is configured to focus the achromatic plane 350 at the reflection plane 361 of the electron mirror 340, which is biased to a potential more negative than the specimen 320 by a few hundred Volts to a few kiloVolt, and thus reflects the electrons 342 and 346 back towards the prism separator 310. The electron mirror 340 is configured to reflect the incoming electrons symmetrically, i.e. electrons entering at an angle with respect to the normal to the electron mirror reflection plane 361 exit the mirror at the same angle and symmetrically with respect to the normal to the electron mirror reflection plane 361. As the remaining electrons 342 and 346 proceed back to the prism separator 310, the electrons 346 with energies larger than $E_0$ are stopped by the same knife-edge plate 610, due to the symmetry of the reflection in the electron mirror 340. The energy width of the remaining nearly monochromatic electrons 342 with energy $E_0$ selected for imaging is defined by the position of the knife-edge plate 610 and can be adjusted by moving the knife-edge plate 610 away or towards the optical axis 620. This arrangement allows the use of a knife-edge plate as the energy selecting device, which is much simpler when compared to the narrow, often sub-micron slits needed in typical imaging energy filter applications. The mechanical design and manufacture of a knife-edge plate is much less complex when compared to a narrow slit aperture with straight and parallel edges and thus allows to select a much narrower energy distribution. In this design, an energy width of 0.2 eV or less is readily achievable. In addition, the reliability of operation of a knife-edge plate under heavy electron bombardment is much improved when compared to slit apertures, as sub-micron slits tend to clog with electron-beam induced contamination. The remaining nearly monochromatic electrons 342 with energy $E_0$ selected for imaging are focused by transfer lens 360 at the achromatic plane 350 of magnetic beam separator 310 and deflected towards second electron mirror 370 that is configured as an aberration corrector. After the second deflection by magnetic beam separator 310 the dispersion vanishes due to symmetry, which is a prerequisite for aberration correction. It is critical to remove the energy dispersion, as otherwise combination aberrations between the dispersion and the chromatic and spherical aberrations of the electron mirror are introduced that can be larger than the original aberrations. Electron mirror 370 is configured to correct for both chromatic and spherical aberration of cathode objective lens 330, and reflects the electron beam back into magnetic beam separator 310. After a third 90 degree deflection through magnetic beam separator 310, the electron beam becomes again energy dispersed, although the range of electron energies is significantly reduced due to the energy filtering. The energy-filtered electron beam exiting magnetic beam separator 310 is focused by transfer lens 840 so that the axial bundle of scattered electrons emanating from achromatic plane 350 of magnetic beam separator 310 is focused at achromatic plane 850 of magnetic beam separator 820. This ensures that after the final deflection by magnetic beam separator 820 into projection optics 860 the dispersion again vanishes due to symmetry, so that combination aberrations between the magnetic prism separator dispersion and the chromatic and spherical aberrations of the projection lenses are removed. The scattered beam exiting magnetic beam separator 820 is then transported into the projection optics 860 and an aberration-corrected and energy-filtered real image as well as diffraction pattern can be magnified on a viewing screen 870.

Figure 9:
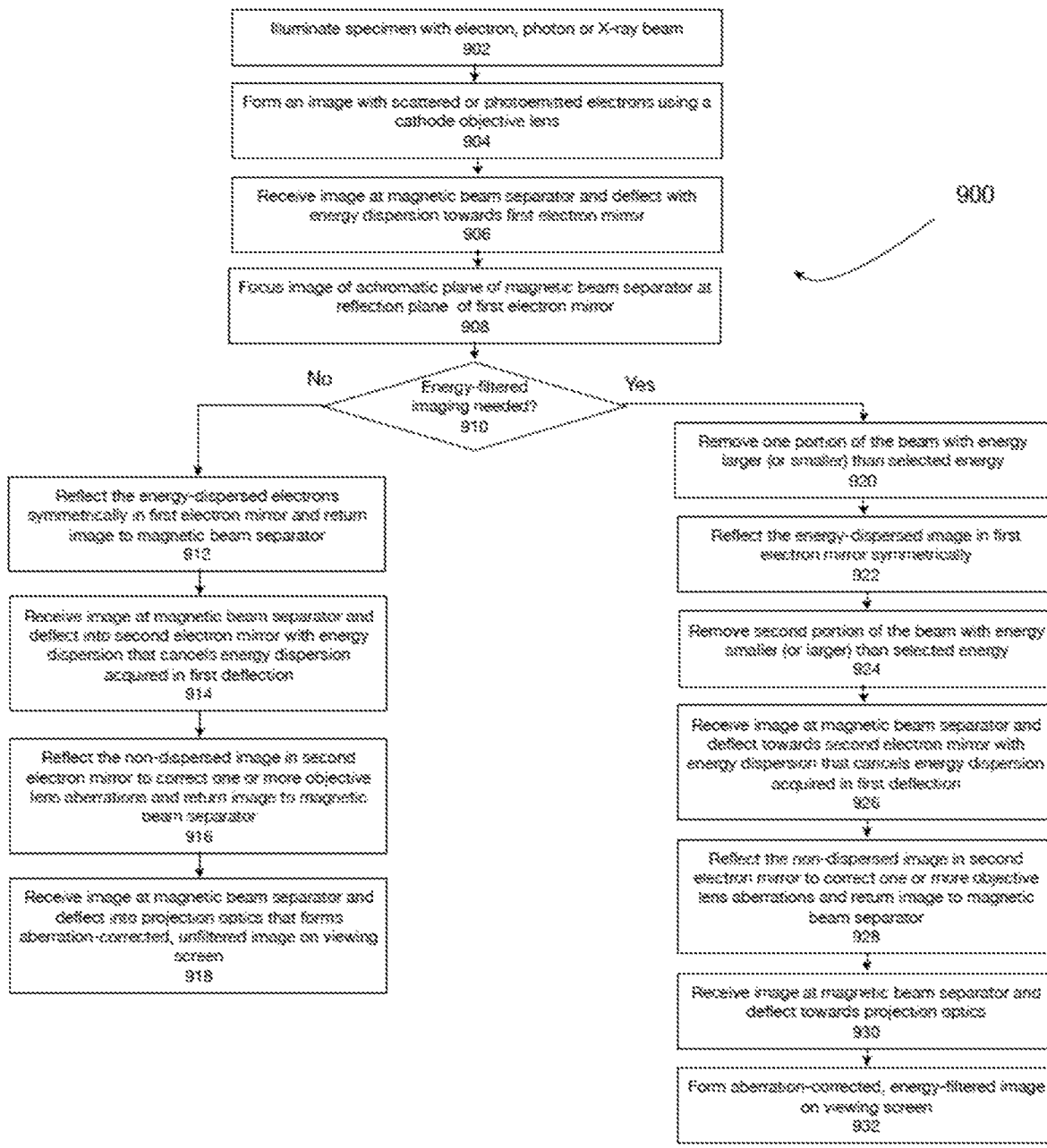
FIG. 9 is a flow chart depicting a method for imaging of a specimen using an aberration corrector and energy filter in accordance with an embodiment of the invention.

FIG. 9 is a flow chart depicting a method 900 for imaging a specimen with aberration correction and energy filtering that includes a magnetic beam separator and two electron mirrors in accordance with an embodiment of the invention. This method 900 may use the structure 300, 400, 500, 600, 700 and 800 described above in relation to FIGS. 3-8.

A primary beam of electrons, photons or X-rays is directed to illuminate 902 the specimen. The primary electrons scatter on the specimen, and photons generate photoemitted electrons. The scattered or photoemitted electrons form 904 an image of the specimen that is magnified by the cathode objective lens. The aberrations of the cathode objective lens blur the image and thus limit the achievable resolution. The electrons are directed towards a magnetic beam separator, deflected by 90 degrees 906 and directed towards first electron mirror. The deflection by 90 degrees 906 introduces dispersion according to the electron energy, due to the fact that the magnetic beam separator deflects the high-energy component of the beam at less of an angle in comparison to the deflection of the low-energy component of the beam, such that the higher and lower energy electron-beam components exit the separator at different angles of trajectory. One or more lenses are used to focus the achromatic plane of the magnetic beam separator, located near its center, at the reflection plane 908 of the first electron mirror. At this point, the user can decide 910 whether to perform energy filtering of the image. When energy-filtering of the image is not desired, all the deflected electrons are reflected 912 in the first electron mirror symmetrically, i.e. electrons entering at an angle with respect to the normal to the electron mirror reflection plane exit the mirror at the same angle and symmetrically with respect to the normal to the electron mirror reflection plane. The electrons are directed towards the magnetic beam separator and deflected by 90 degrees 914. Due to the symmetry introduced by the first electron mirror, the energy dispersion introduced by second deflection 914 cancels the dispersion introduced by first deflection 906. The dispersion-free electron beam is then reflected 916 in the second electron mirror which corrects one or more aberrations of the objective lens. After the reflection, electrons are directed towards the magnetic beam separator and deflected by 90 degrees 918 towards the projection optics which forms a magnified, aberration-corrected and unfiltered image on a viewing screen. When energy-filtering of the image is desired, a knife-edge plate is inserted and removes one portion of the beam 920, either the electrons with larger energy than selected nominal energy $E_0$ or with energy lower than energy $E_0$. The first electron mirror reflects the electron beam 922 and due to symmetry, the remaining portion of the beam except the beam with nominal energy $E_0$ is removed 924 by the same knife-edge plate. The remaining portion of the electron beam with nominal energy $E_0$ is then directed towards the magnetic beam separator and deflected by 90 degrees 926. Due to the symmetry introduced by the first electron mirror, the energy dispersion introduced by second deflection 926 cancels the dispersion introduced by first deflection 906. The dispersion-free electron beam with nominal energy $E_0$ is then reflected 928 in the second electron mirror which corrects one or more aberrations of the objective lens. After the reflection, electrons are directed towards the magnetic beam separator and deflected by 90 degrees 930 towards the projection optics which forms 932 a magnified, aberration-corrected and energy-filtered image on a viewing screen.

CONCLUSION

An aberration corrector for electron lenses and an electron energy filter comprising an energy-dispersive magnetic beam separator and two electron mirrors is disclosed herein. The specimen is illuminated with an electron, photon or X-ray beam, and the electron beam emitted from the specimen and magnified by a cathode objective lens is deflected by the magnetic beam separator towards a first electron mirror. The magnetic beam separator deflects the electron beam by 90 degrees and thus introduces dispersion according to electron energy. The magnetic beam separator deflects the high-energy component of the beam at less of an angle in comparison to its deflection of the low-energy component of the beam, such that the higher and lower energy electron-beam components exit the separator at different angles of trajectory. One or more lenses are used to focus the achromatic plane of the magnetic beam separator, located near the separator center, at the reflection plane of the first electron mirror. When energy filtering is needed, a knife-edge plate is inserted that removes all of the beam with energy larger and smaller than the selected energy. The reflected electron beam is then deflected by 90 degrees, which removes the energy dispersion once the beam exits the magnetic beam separator. The electron beam then enters the second electron mirror which corrects one or more aberrations of the cathode objective lens and reflects the beam back into the magnetic beam separator. The electron beam is deflected by 90 degrees towards the projection optics which forms a magnified, aberration-corrected and, if needed, energy-filtered image on a viewing screen.

In accordance with certain embodiments of the invention, this aberration corrector provides the opportunity to improve the spatial resolution of images acquired by an electron microscope. Hence, more detailed information about the local structure and morphology is obtainable in electron microscopes used to characterize specimens.

In accordance with certain embodiments of the invention, this energy filter provides the opportunity to use scattered electrons with a very narrow range of energies for the formation of an image of the specimen. Hence, detailed information about the chemical composition, interatomic bonding and local electronic states is obtainable in electron microscopes used to characterize specimens.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for forming an aberration-corrected image in an electron microscope, the apparatus comprising:
    an electron objective lens configured to form an image using electrons emitted or scattered by a specimen;
    a first electron mirror configured to reflect the electrons, wherein electrons entering at an angle with respect to the normal to the reflection plane of first electron mirror exit symmetrically with respect to the normal and substantially at the same angle;
    a second mirror electron mirror configured to correct one or more aberrations introduced by the electron objective lens;
    an energy-dispersive device configured to:
        deflect the electrons leaving the specimen towards the first electron mirror so that the high energy electrons are deflected at less of an angle in comparison to the deflection angle of the low energy electrons and the high and low energy electrons exit the energy-dispersive device at different angles of trajectory,
        deflect the electrons reflected from first electron mirror towards the second electron mirror so that the low and high energy electrons are rejoined and exit the dispersive device substantially along the same angle of trajectory with the energy dispersion removed, and
        deflect the electrons reflected from second electron mirror towards an electron detector;
    a first plurality of electron lenses configured to converge all electrons exiting the energy-dispersive device at different angles of trajectory at the reflection plane of the first electron mirror;
    a second plurality of electron lenses configured to transport the electrons exiting the energy-dispersive device into the second electron mirror.

2. The apparatus of claim 1, wherein the energy-dispersive device deflects the electrons by approximately 90 degrees during each deflection step.

3. The apparatus of claim 1, wherein the energy-dispersive device is a magnetic prism composed of an array of uniform magnetic fields of different length and strength with corresponding transient magnetic fields.

4. The apparatus of claim 1, further comprising:
    a light source generating photons or X-rays and configured to illuminate the specimen,
    a plurality of electron lenses configured to:
        transport the electrons exiting the energy-dispersive device towards the electron detector, and
        form a two-dimensional electron image on the electron detector.

5. The apparatus of claim 4, wherein the electron detector comprises:
    an electron scintillator transforming the two-dimensional electron image into a light image; and
    a light optics configured to transport the light image to an image sensor.

6. The apparatus of claim 1, further comprising:
    a particle source configured to generate electrons;
    a second energy-dispersive device configured to:
        deflect the electrons generated by the particle source towards the first energy-dispersive device,
        deflect the electron beam exiting first energy-dispersive device towards the electron detector so that the low and high energy electrons beam are rejoined and exit the second energy-dispersive device substantially along the same angle of trajectory with the energy dispersion removed,
    a first plurality of electron lenses configured to direct the electrons from the particle source towards the second energy-dispersive device;
    a second plurality of electron lenses configured to transport the electrons between the energy-dispersive devices; and
    a third plurality of electron lenses configured to:
        transport the electrons exiting the second energy-dispersive device towards the electron detector, and
        form a two-dimensional electron image on the electron detector.

7. The apparatus of claim 6, wherein the second energy-dispersive device deflects the electrons by approximately 90 degrees during each deflection step.

8. The apparatus of claim 6, wherein the second energy-dispersive device is substantially identical to the first energy-dispersive device.

9. The apparatus of claim 6, wherein the electron detector comprises:
    an electron scintillator transforming the two-dimensional electron image into a light image; and
    a light optics configured to transport the light image to an image sensor.

10. The apparatus of claim 1, further comprising:
    an energy-selective device that removes all electrons with energies higher and lower than a selected energy.

11. The apparatus of claim 10, wherein the energy-selective device is a movable knife-edge plate positioned between the energy-dispersive device and the first electron mirror.

12. The apparatus of claim 10, wherein the strength of the energy-dispersive device is configured to select a specific electron energy for imaging.

13. The apparatus of claim 10, further comprising:
    a light source generating photons or X-rays and configured to illuminate the specimen,
    a plurality of electron lenses configured to:
        transport the electrons exiting the energy-dispersive device towards the electron detector, and
        form a two-dimensional electron image on the electron detector.

14. The apparatus of claim 13, wherein the electron detector comprises:
    an electron scintillator transforming the two-dimensional electron image into a light image; and
    a light optics configured to transport said light image to an image sensor.

15. The apparatus of claim 10, further comprising:
a particle source configured to generate electrons;
a second energy-dispersive device configured to:
- deflect the electrons generated by the particle source towards the first energy-dispersive device,
- deflect the electrons exiting first energy-dispersive device towards the electron detector so that the low and high energy electrons are rejoined and exit the second energy-dispersive device substantially along the same angle of trajectory with the energy dispersion removed;

a first plurality of electron lenses configured to direct the electrons generated by the particle source towards the second energy-dispersive device;
a second plurality of electron lenses configured to transport the electrons between the energy-dispersive devices; and
a third plurality of electron lenses configured to:
- transport the electrons exiting the second energy-dispersive device towards the electron detector, and
- form a two-dimensional electron image on the electron detector.

16. The apparatus of claim 15, wherein the second energy-dispersive device deflects the electrons by approximately 90 degrees during each deflection step.

17. The apparatus of claim 15, wherein the second energy-dispersive device is substantially identical to the first energy-dispersive device.

18. The apparatus of claim 15, wherein the electron detector comprises:
- an electron scintillator transforming the two-dimensional electron image into a light image; and
- a light optics configured to transport the light image to an image sensor.

19. A method for forming an aberration-corrected image from an image blurred by aberrations of the objective lens in a electron microscope, the method comprising:

illuminating a specimen with an electron, photon or X-ray beam;
generating an electron beam emitted or scattered by the the sample with a range of electron energies;
deflecting the higher and lower energy electron beam components at different angles of trajectory in an energy-dispersive device towards a first electron mirror;
converging all energy components of the energy-dispersed electron beam deflected at different angles of trajectory at the reflection plane of first electron mirror;
reflecting the electron beam in first electron mirror such that electrons entering at an angle with respect to the normal to the mirror reflection plane exit symmetrically with respect to said normal and substantially at the same angle;
deflecting the electron beam reflected from the first electron mirror towards a second electron mirror so that the lower and higher energy components of the electron beam are rejoined and exit the energy-dispersive device substantially along the same angle of trajectory and with the energy dispersion removed,
reflecting the electron beam in the second electron mirror configured to correct the objective lens aberrations,
deflecting the electron beam reflected from the second electron mirror towards the electron detector, and
forming an aberration-corrected image on the electron detector.

20. The method of claim 19, further comprising:
removing all electrons with energies higher and lower than a selected energy by an energy-selective device positioned between the energy-dispersive device and the first electron mirror; and
forming an aberration-corrected and energy-filtered image on the electron detector.

* * * * *